United States Patent

Alleaume

(10) Patent No.: US 8,627,238 B2
(45) Date of Patent: Jan. 7, 2014

(54) PROCESS AND SYSTEM FOR DESIGNING A PHOTOLITHOGRAPHY MASK AND A LIGHT SOURCE

(71) Applicant: STMicroelectronis (Crolles 2) SAS, Crolles (FR)

(72) Inventor: Clovis Alleaume, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/727,172

(22) Filed: Dec. 26, 2012

(65) Prior Publication Data

US 2013/0164658 A1    Jun. 27, 2013

(30) Foreign Application Priority Data

Dec. 27, 2011 (FR) ..................... 11 62470

(51) Int. Cl.
*G06F 17/50* (2006.01)

(52) U.S. Cl.
USPC ............................................. 716/51; 716/54

(58) Field of Classification Search
USPC ...................................... 716/51, 54
See application file for complete search history.

(56) References Cited

U.S. PATENT DOCUMENTS

| 7,694,267 | B1 | 4/2010 | Ye et al. |
| 8,356,261 | B1 * | 1/2013 | Socha ............................. 716/54 |
| 2005/0177810 | A1 | 8/2005 | Heng et al. |
| 2006/0126046 | A1 * | 6/2006 | Hansen .......................... 355/55 |
| 2009/0125870 | A1 * | 5/2009 | Aton et al. ..................... 716/21 |
| 2011/0119642 | A1 | 5/2011 | Agarwal et al. |
| 2012/0051622 | A1 * | 3/2012 | Gyoda et al. .................. 382/144 |
| 2012/0075605 | A1 * | 3/2012 | Chen .............................. 355/67 |
| 2013/0036390 | A1 * | 2/2013 | Torres Robles et al. ........ 716/54 |
| 2013/0074017 | A1 * | 3/2013 | Iwase et al. .................... 716/52 |

OTHER PUBLICATIONS

Banerjee et al., SMATO: Simultaneous Mask and Target Optimization for Improving Lithographic Process Window, Nov. 7, 2010 pp. 100-106.
Choi et al., Illumination and multi-step OPC Optimization to Enhance Process Margin of the 65nm node Device Exposed by Dipole Illumination, Jan. 1, 2004, pp. 838-845.

* cited by examiner

*Primary Examiner* — Suresh Memula
(74) *Attorney, Agent, or Firm* — Allen, Dyer, Doppelt, Milbrath & Gilchrist, P.A.

(57) ABSTRACT

A method for designing a photolithography mask and a light source may include designing an initial photolithography mask and an initial light source using an initial target pattern corresponding to a desired target pattern in a resist layer. The method may also include designing a new target pattern and designing a new photolithography mask and/or a new light source using the new target pattern.

15 Claims, 5 Drawing Sheets

PROCESS AND SYSTEM FOR DESIGNING A PHOTOLITHOGRAPHY MASK AND A LIGHT SOURCE

FIELD OF THE INVENTION

The invention relates to integrated circuits, and especially to photolithography, and, in particular, to the design of target patterns to be used to design photolithography masks and light sources used in microelectronics.

BACKGROUND OF THE INVENTION

During the implementation of a photolithography step allowing an integrated circuit to be produced, a light source is used to illuminate a photolithography mask and thus project an image onto a resist layer placed on a substrate, often a semiconductor substrate. A pattern is then formed in the resist layer, and steps of implanting dopant atoms or etching steps may be implemented using the resist as a mask.

Generally, the pattern formed in the resist has a different geometry to that of the pattern present on the mask. This is because various optical effects can modify the geometry of the patterns formed in a resist layer. These effects, commonly called proximity effects, appear during the implementation of photolithography steps for forming small or closely spaced patterns. It has been proposed to modify the masks prior to the photolithography to take into account proximity effects, implementing what are called optical proximity correction (OPC) processes.

In an OPC process, a photolithography mask is designed allowing a desired target pattern to be obtained in a resist layer, despite proximity effects. This target pattern is a pattern that is conventionally designed using the circuit layout. Even if the target pattern is generally similar to this layout, it may be different to make producing the pattern in the resist easier, or also to make subsequent steps of etching or implantation of dopant atoms easier. Various rules are used to design the target pattern. By way of example, these rules may comprise geometric design rules—it is, for example, easier to produce wider lines.

Another exemplary rule is that of overetching. If the photolithography step is followed by an etching step that systematically etches too much material, this overetch may be taken into account by increasing the size of the resist patterns.

It is noted that the designed target may be checked to ensure that the resist pattern performs its function. It is, for example, recommended to check that there is no risk of undesired contact, for example electrical contact, being made, and that the desired, for example, electrical contacts are indeed provided for by the target pattern.

Once the target pattern has been designed by virtue of a set of rules, a simulation mask may be designed by implementing photolithography simulation steps to obtain a simulated resist pattern to compare with the target pattern. The simulated mask is then modified, and the simulation, comparison and modification steps are repeated. After a certain number of iterations, for example 10, a photolithography mask is obtained that provides a resist pattern similar to the target pattern.

By way of example, to implement an OPC process, the software package nmOPC from the company Mentor Graphics of Wilsonville, Oreg. may be used.

To improve the photolithography steps it has also been proposed to use light sources having a complex geometry, comprising, for example, several light spots. The light source to be used may then be defined as that which allows a resist pattern similar to the target pattern to be obtained. For this purpose, source mask optimization (SMO) processes, known to those skilled in the art, may be used. Various software packages allow a light source corresponding to a target pattern to be obtained. For example a target pattern may be made using the software package sold under the trade name Tachyon by the company Brion Technology of Santa Clara, Calif.

OPC or SMO processes, which allow the quality of implementation of a photolithography step to be improved, address drawbacks due to unexpected variations in the parameters of a photolithography step to be mitigated. Among these parameters are the luminous power, or dose, received by the resist, which may vary slightly, and also the focus. During the implementation of a photolithography step, in addition to the light source, the mask, and the resist layer, an optical system for forming an image in a focal plane located level with the resist, is used. If the wafer is shifted along the optical axis of this system, for example by a few tens of nanometers, the resist finds itself in a plane located out of the focal plane of the optical system. These focal variations may modify the luminous contrast received by the resist and therefore its polymerization, and consequently the geometry of the resist patterns obtained. Likewise, the light intensity delivered by the source may vary due to poorly controlled external parameters. The dose/focus process window is therefore generally spoken of by those skilled in the art.

SUMMARY OF THE INVENTION

According to one method of implementation and embodiment, the robustness of photolithography processes with respect to parameter variations in a photolithography step may be improved.

According to one aspect, a process for designing a photolithography mask and a light source, may include designing an initial photolithography mask and an initial light source using an initial target pattern formed using an initial group of points corresponding to a desired target pattern in a resist layer. The process may include a step of designing a new target pattern, which may include two photolithography simulations using the initial mask and the initial light source and, respectively, two different focuses. Each simulation delivers a set of simulated light intensity values. The simulated values are associated with a set of points on the resist layer.

Designing the new target pattern may also include defining, among the various sets of points, a group of points comprising points in the resist layer for which the value of the simulated light intensity is the same for both simulations and/or points forming local maxima in the variation in the simulated light intensity values obtained by one of the two simulations. The group of points forms the outline of the new target pattern. Each point in the group of points corresponds to a point in the initial group of points.

The process also includes designing a new photolithography mask and/or a new light source using the new target pattern. The initial target pattern is here formed by a group of initial points, and according to one embodiment, segments pass through these points to form the initial target pattern. The points defined in the step of designing the new target pattern then allow the initial target pattern to be modified by moving the segments of the initial target pattern, which will then pass through the defined points to form the new target pattern.

The points for which a given light intensity value is obtained for both of the different focuses are points that are insensitive to undesired focal variations. The use of a target that passes through these points allows a target to be obtained which enables a new mask and a new source which are less sensitive to focal variations to be designed.

In the case where there are no points with equal light intensity, the points, obtained by one of the two simulations, for which the intensity variation is maximum, are determined. At these points, an undesired variation in light intensity due to the source slightly shifts the resist outline obtained after a photolithography step by a mask, and a source designed using the target pattern the outline of which passes through these points. This small shift is due to the slope of the light intensity curve, which shifts vertically if the intensity varies.

Therefore, by using these points, a target pattern outline is obtained that allows a mask and a light source to be designed that may be less sensitive to parameter variations, for example, the focus or the light intensity. In other words, the process window is larger.

It will be noted that the initial mask, the new mask, the initial light source, and the new light source may each be obtained by OPC or SMO processes using the initial target pattern or the target pattern obtained in the step of designing the new target pattern. Any process for designing photolithography masks and any process for designing light sources may be used.

Of course, it is possible to use the target obtained only to design a new mask, or a new light source. Tolerance of parameter variations in the photolithography step is increased even by using a new mask and an initial source. Such is also the case when a new light source and an initial mask are used. Of course, a greater robustness is obtained by designing the new mask and the new light source using the target.

Since the initial target pattern is formed using an initial group of points, each point in the initial group may be made to correspond to a point in the group of points allowing the outline of the new target pattern to be formed. Thus, a search is carried out, either for a point having the same light intensity or for a point having a maximum light intensity variation, in a study window corresponding to a portion of resist area located in the vicinity of a point in the initial group. The size of this study window may be chosen to include only one point in the initial group and no neighboring point. According to one method of implementation, the points of maximum variation in light intensity may be sought along an axis perpendicular to the initial target pattern, passing though a point in the initial group. Thus, the derivative of the light intensity is calculated on this axis.

Of course, if in such a study window several points are found, for example, corresponding to equal light intensity, the point closest to the point in the initial group may be chosen. The same is true in the absence of points for which the light intensity is the same, the closest point for which the variation in the light intensity, on the axis such as defined above, is maximum then being chosen.

The process may furthermore comprise repeating the new target pattern design new photolithography mask and/or new light design steps at least once, using the new photolithography mask as the initial mask and/or the new light source. More precisely, the two photolithography simulations are carried out using the new photolithography mask and/or the new light source to design another target and to design another photolithography mask and another light source. After each repetition, a mask and/or a light source that is more robust with respect to parameter variations in a photolithography step is/are obtained. Ten repetitions may, for example, be carried out.

The points forming local maxima in the variation in the simulated light intensity values may be obtained by one of the two simulations, the focus of which is correct. The term "correct" is understood to mean a simulation in which the projection of an image onto the plane of the resist is simulated, the wafer and the resist not being shifted. Since the two focuses are different, the focus of the other simulation is therefore incorrect, and may correspond to a shift of about a few tens of nanometers, for example, 50 nanometers.

The definition of the group of points may comprise determining local minima in the absolute value of the difference in intensity value obtained by the two simulations. The difference is divided by the value of the normalized derivative of the light intensity along an axis perpendicular to the initial target pattern passing though a point in the initial target pattern. The light intensity is that obtained by one of the two simulations, for which simulation the focus is correct. This calculation allows both the points for which the intensity is the same for both simulations and also the points corresponding to the highest variation in light intensity to be determined. It will be noted that the expression "local minima" is understood to mean points located on an axis perpendicular to the initial target pattern, passing through a point in the initial target pattern, and located in the vicinity of this point.

The process may furthermore comprise checking the target pattern designed in the designing step. This checking operation makes it possible to ensure that the group of points forming a target pattern outline completely respect the function of the pattern to be formed in the resist, for example, it is desirable that the new target pattern not create undesired, or remove undesired, contacts.

It will be noted that the modification of the target pattern does not depend on a set of rules, but on optical simulations (the mask and the light source are simulated). It therefore may also be desirable to check the new target pattern obtained.

According to another aspect, an electronic system is provided, for example, a computer, whether portable or not, or even a processor and its associated memory, comprising means or circuitry configured to implement the process such as defined above. According to another aspect, a computer program product is provided that can be directly loaded into a memory of an electronic system, comprising sections of computer code for executing the process as defined above when the program is executed by the electronic system.

According to another aspect, a medium that can be read by an electronic system is provided. The medium includes instructions that can be executed by a computer. The instructions cause the electronic system to execute the process such as defined above.

DETAILED DESCRIPTION OF THE PREFERRED EMBODIMENTS

Figure 1:
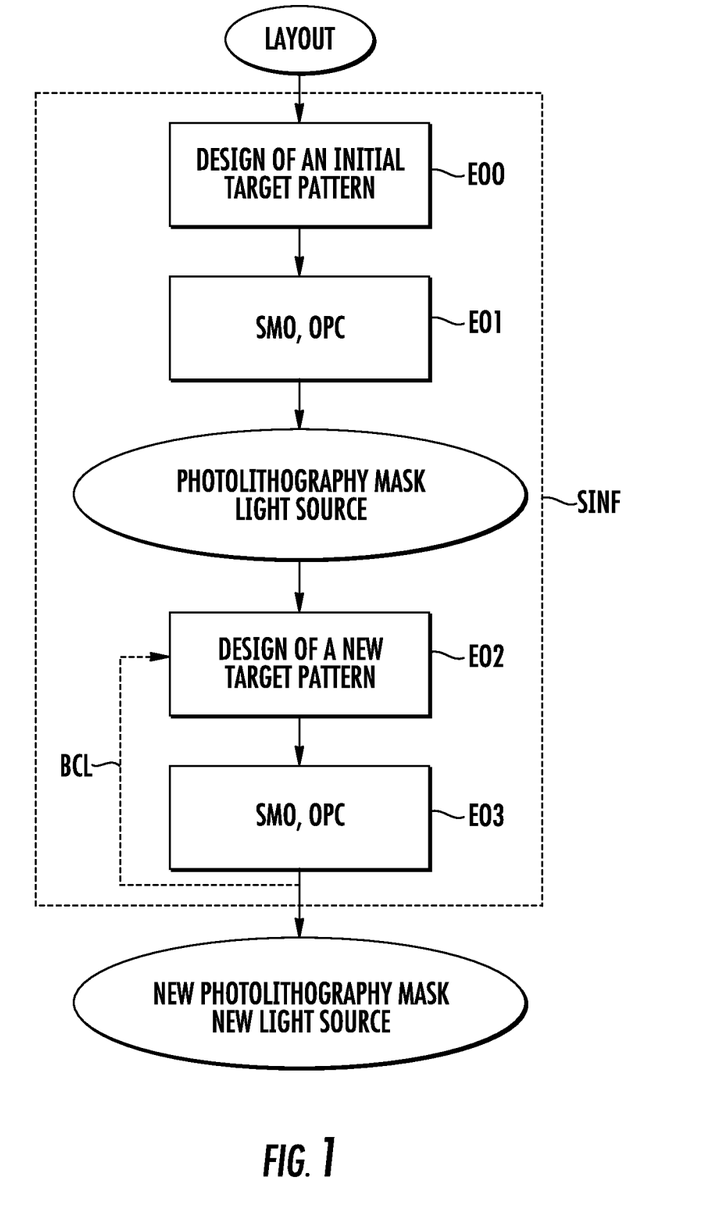
FIG. 1 is a flow diagram illustrating the various steps of a method of implementing a process according to the present invention.

In FIG. 1, the reference SINF denotes the an electronic system, for example, a computer, comprising means or a central processing unit and memory configured to execute a method of implementing the process according to the embodiments.

According to this embodiment illustrated in FIG. 1, provision is firstly made for an initial target pattern to be designed (step E00) following a layout, for example, using a set of geometric design rules. The initial target pattern is a pattern that is very similar to the layout which is intended to be formed in a resist layer. This initial target pattern makes implementation of a subsequent photolithography step easier, or equally makes implementation of an etching step or a step of implanting doping atoms, using a resist mask, easier.

Next, the initial target pattern designed in step E00 may be used to design (step E01) a photolithography mask and a light source. Step E01 may comprise implementing SMO or OPC processes using the initial target pattern, and possibly comprise photolithography simulations, comparing a simulated resist pattern with the initial target pattern, and modifying a photolithography mask and/or a light source with a view to making the simulated resist pattern more closely resemble the initial target pattern. The SMO or OPC processes may comprise several repetitions in order to allow a correct photolithography mask and a correct light source to be designed. By way of example, an OPC process may comprise ten photolithography simulations.

The photolithography mask and the light source obtained after step E01 are not necessarily designed with parameter variations in a photolithography step, such as focal variations and variations in light energy dose, taken into consideration. These masks obtained in step E01 are used to design a new target pattern (step E02). This step comprises two photolithography simulations and determination of points in the resist that are least sensitive to parameter variations in a photolithography step.

Use of this new target pattern allows a new photolithography mask and/or a new light source to be designed, for example, using OPC or SMO processes, in step E03. It is also possible to use the new photolithography mask and the new light source to implement new photolithography simulations and therefore to repeat step E02 (loop BCL). It is, for example, possible to repeat the loop BCL about ten times. The use of a mask and/or source that take parameter variations in a photolithography step into consideration in step E02 allows, after step E02 has been repeated, new masks and new sources to be obtained which make photolithography steps employing them more robust.

Figure 2:
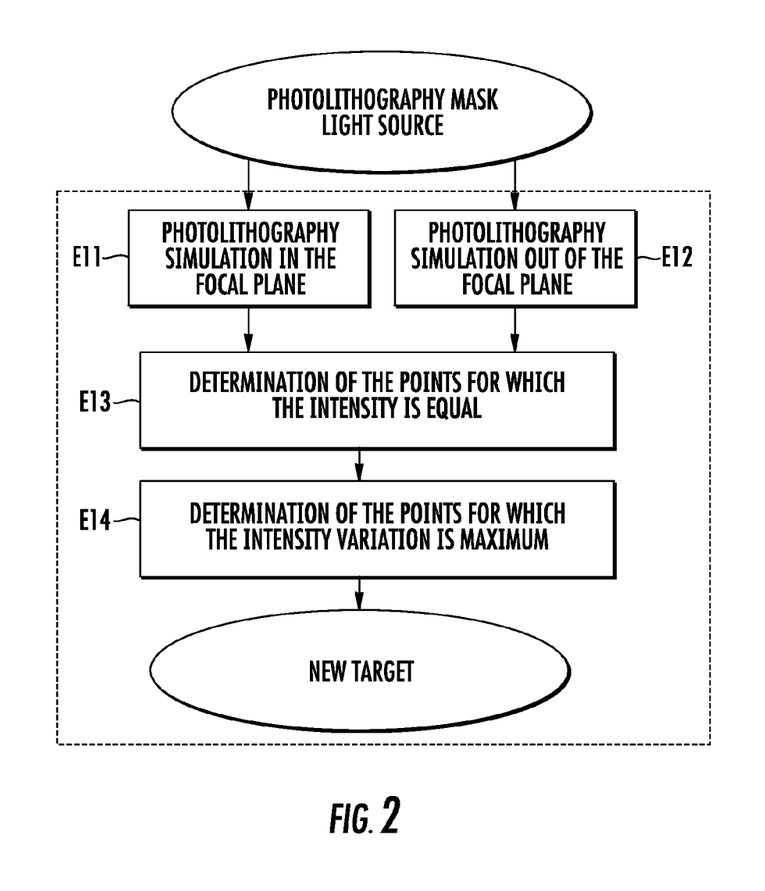
FIG. 2 is a flow diagram illustrates a step of designing a target pattern according to the present invention.

FIG. 2 shows schematically, and in greater detail, how a new target pattern is designed using a photolithography mask and a light source, for example, designed by implementing step E01 or also by implementing step E02. In step E02, a step E11 of photolithography simulation is implemented with a correct focus. In other words, when step E11 is implemented, the projection of an image into the plane of the resist is simulated. Thus the focal plane of the simulated optical system is located in the resist layer.

Step E12 is also a photolithography simulation step, but in which the focus is not correct. Thus, the image is not projected into the plane of the resist, but out of this plane, for example, by a few tens of nanometers. The focal plane of the simulated optical system is located out of the resist layer. Such a shift is commonly called defocus by those skilled in the art.

The two photolithography simulations (steps E11 and E12) deliver sets of values of the light intensity in the resist, these values being obtained by simulation. In step E13 points are determined for which the intensity is equal in both simulations. The outline of the initial target pattern or any other target pattern designed beforehand may also be used to determine these points. More precisely, for each point on the outline of the initial, or previously designed, target pattern the closest point for which the intensity is equal is chosen. This point is not very sensitive to focal variations.

Next, step E14 is implemented in which points are determined for which the spatial variation in light intensity is highest in the vicinity of points in the initial target pattern, or also along an axis perpendicular to the initial target pattern passing through these points in the initial target pattern, among the values obtained in step E11, i.e. for a correct focus. It will be noted that, in step E13, if there are no points having equal light intensity in the vicinity of points of the target pattern, a point for which the variation in light intensity is maximum is chosen.

It is possible to implement steps E13 and E14 simultaneously, and thus determine all the desired points. The minimum in the absolute value of the difference in the intensity value obtained by the two simulations may, for example, be calculated in the vicinity of each point of the initial target pattern. The difference is divided by the normalized derivative of the light intensity along an axis perpendicular to the initial target pattern passing through a point of the initial pattern obtained by the simulation for which the focus is correct. This local minimum then corresponding to a point for which the intensity is equal (the difference being zero) or else for which the variation is maximum (the denominator of the quotient being a local maximum). Using the points determined in the way described above, a new target pattern is obtained.

Figure 3:
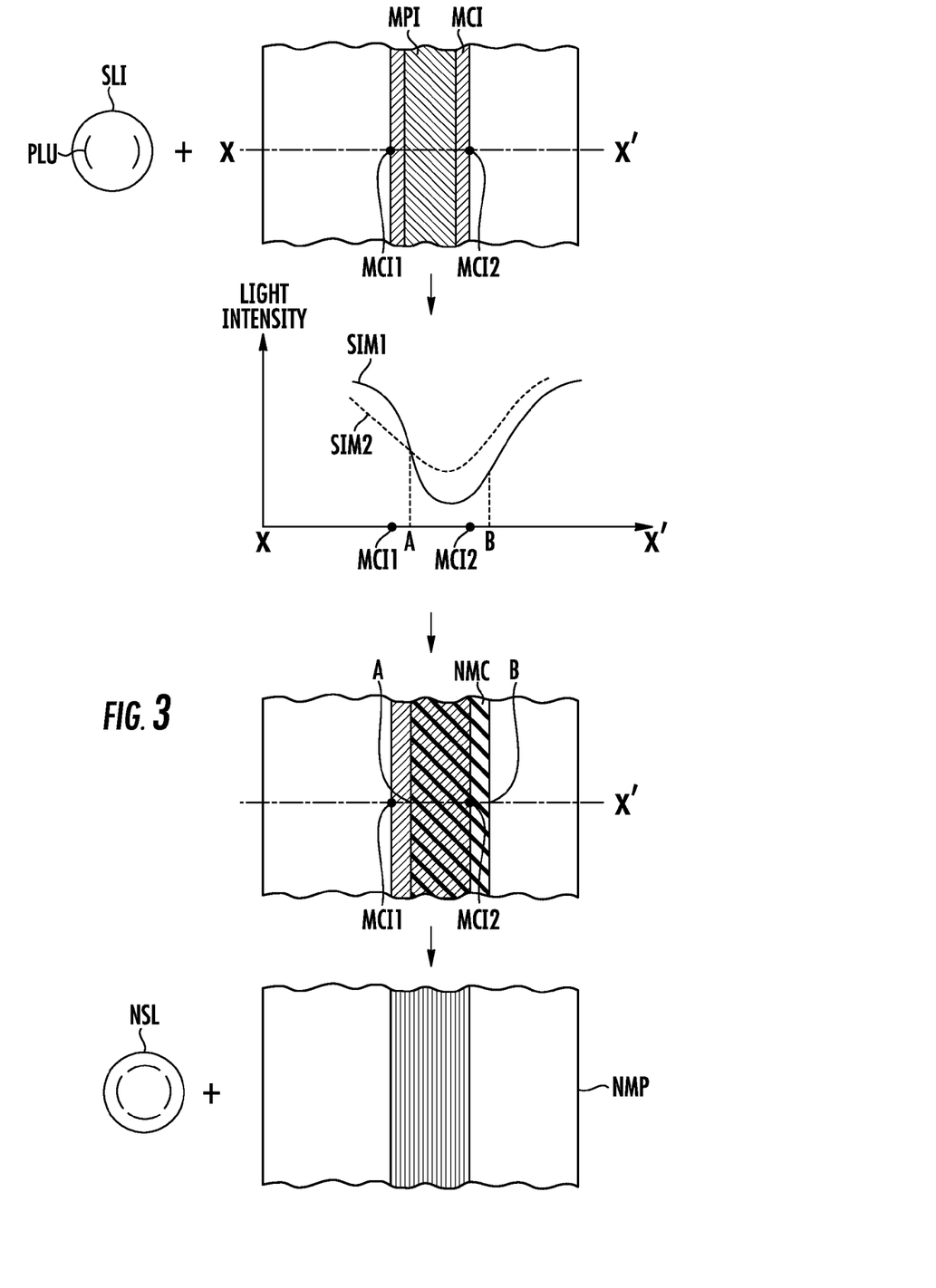
FIG. 3 is a flow diagram schematically illustrating an exemplary definition of points for designing a target pattern according to the present invention.

FIG. 3 shows schematically the design of a new mask and a new light source, for a layout corresponding to a resist strip. Beforehand, an initial target pattern MCI and an initial photolithography mask MPI designed using this target pattern have been obtained. The initial target pattern MCI and the initial photolithography mask have been shown superposed. An initial light source SLI has also been designed using the initial target pattern, for example a complex light source comprising two light portions PLU.

Photolithography simulations may be implemented using the initial light source SLI, the photolithography mask MPI and the initial target pattern. Of course, since the pattern studied here is a resist strip, the entire strip may not have to be studied during simulations. It is, for example, possible to study the light intensity value along the axis X-X', which is perpendicular to the initial target pattern MCI.

The variation in the light intensity has been shown for two simulations, a first simulation SIM1, shown by a solid line, for which the focus is correct, and a second simulation SIM2, shown by a dashed line, for which the focus is incorrect, for example, shifted by a few tens of nanometers.

The initial target pattern is formed by two points on the axis X-X', these points MCI1 and MCI2 representing the two outlines of the desired resist strip. Points for which the value of the light intensity obtained by the two simulations are equal, or points for which the variation in light intensity in the simulation SIM1 are at a maximum, are therefore looked for in the vicinity of these two points MCI1 and MCI2.

In the vicinity of point MCI1, the two curves illustrating the light intensity cross at point A. Point A is therefore a point for which a focal variation does not cause a shift along the axis X-X'. At no point in the vicinity of point MCI2 are the simulated light intensities equal. The point for which the variation in light intensity of simulation SIM1 is maximum, point B, is determined instead. Point B corresponds to a point that is not very sensitive to intensity variations. In other words, a variation in the light intensity may not cause a substantial shift along the axis X-X' since at point B the slope is nearly vertical.

Points A and B define the outline of a new target pattern NMC that will be less sensitive both to focal variations and to variations in light intensity. A new photolithography mask NMP and a new light source NSL may be designed using this new target pattern NMC, for example, by implementing OPC or SMO processes. The new mask and the new source, when used in a photolithography step, produces resist patterns that have a more stable geometry even if the focus shifts or the light intensity varies.

Figure 4:
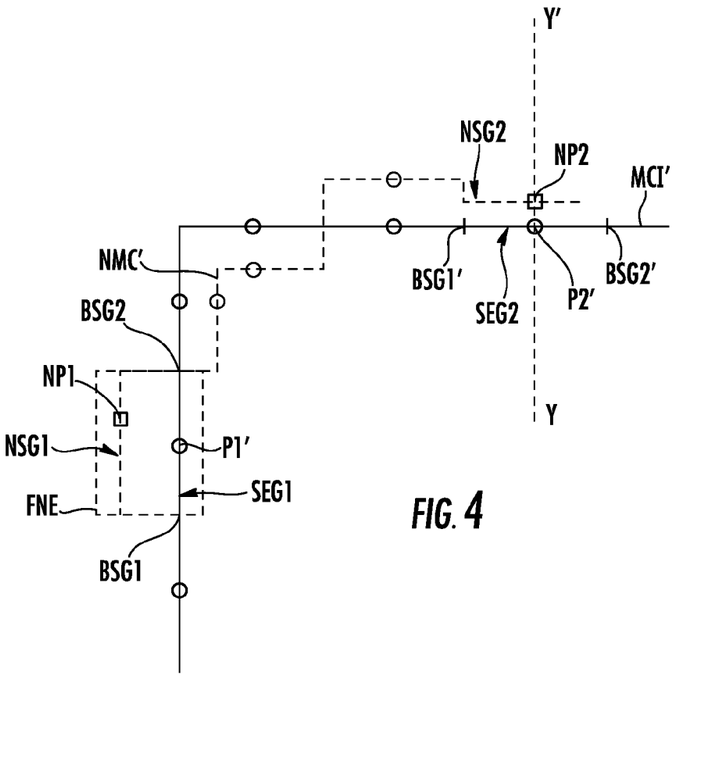
FIG. 4 is a schematic diagram illustrating an exemplary definition of points for designing a target pattern in accordance with another embodiment of the present invention.

FIG. 4 schematically illustrates another example or embodiment in which the pattern is not a resist strip but a resist corner. The points forming the outline of the initial target pattern MCI' used here have been represented by solid circles. The outline of the target pattern comprises a number of segments, each passing through these filled circles. In the vicinity of these filled circles, the points the least sensitive to parameter variations in a photolithography step are determined. Two simulations may be implemented and the points for which the light intensity is equal, for example, in a study window placed around each point forming the outline of the initial target pattern MCI', or for which the variation is maximum, for example, along an axis passing through a point of the initial target pattern and perpendicular to the initial target pattern, are determined.

In the vicinity of the point P1' belonging to a segment SEG1 of the initial target pattern MCI', bounded by points BSG1 and BSG2, in the study window FNE, it is possible to determine, after implementing the two simulations, that the point NP1 is the closest point to the point P1' for which the light intensity obtained by the two simulations is equal. The points for which the light intensity is equal are illustrated by hollow circles.

If no such point exists, it is possible, for example along an axis Y-Y' passing through a point P2' belonging to segment SEG2 of the initial target pattern MCI', bounded by points BSG1' and BSG2', to calculate the normalized derivative of the light intensity along this axis Y-Y', and thus determine the local maximum, here point NP2. The points for which the variation in the light intensity are at a maximum are shown here by hollow squares.

By using all the points thus defined, a new target pattern NMC' is obtained that may be used to design a new photolithography mask and a new light source. This target pattern NMC' comprises a number of segments, for example segments NSG1 and NSG2.

Figure 5A:
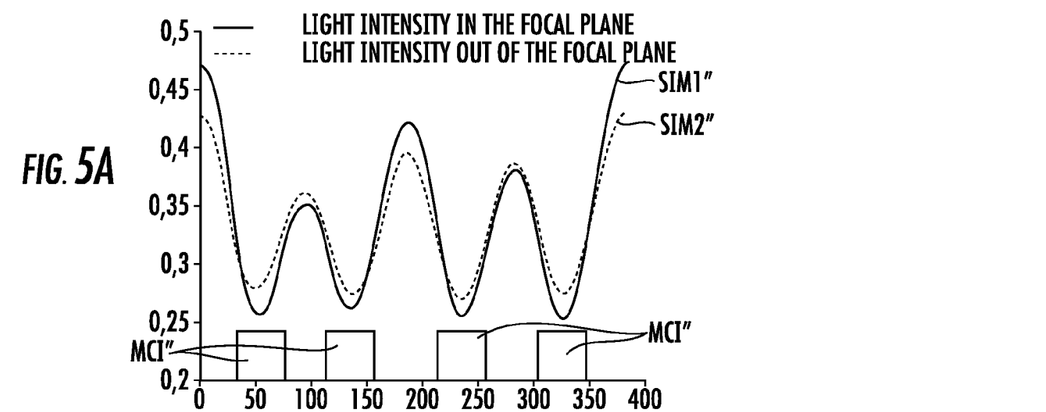
FIGS. 5a-5d are graphs illustrating another example definition of points for designing a target pattern according to the present invention.

FIGS. 5a-5d are graphs illustrating another example definition of points in which it is desirable to form a number of parallel resist strips. An initial target pattern MCI" has been obtained beforehand and a photolithography mask and a light source corresponding to this initial target pattern MCI" (FIG. 5a).

Two photolithography simulations are implemented, a simulation SIM1" for which the focus is correct and a simulation SIM2" for which the focus is shifted, and the simulated light intensity values obtained by the two simulations are shown along an axis lying transverse to the desired patterns.

Figure 5B:
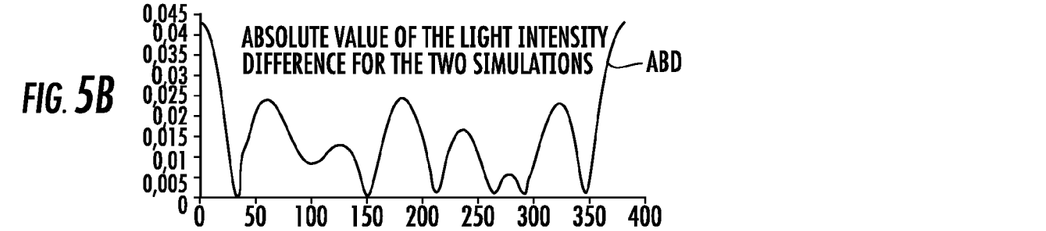
Figure 5C:
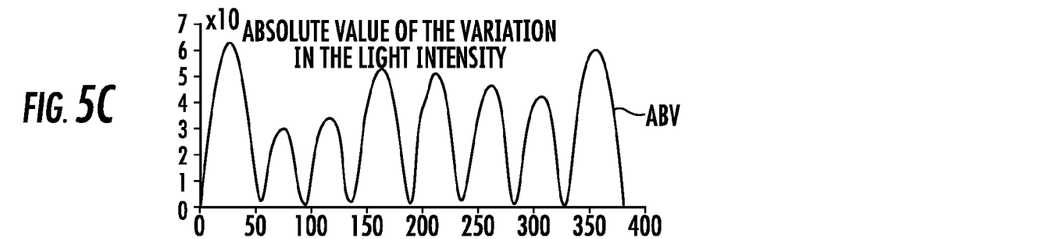

The absolute value of the difference between the two curves ABD has also been shown (FIG. 5b). Zero values are obtained when the values obtained by the two simulations are equal. Moreover, the absolute value of the variation in the light intensity ABV is also shown for the values obtained by the simulation with a correct focus (FIG. 5c).

Figure 5D:
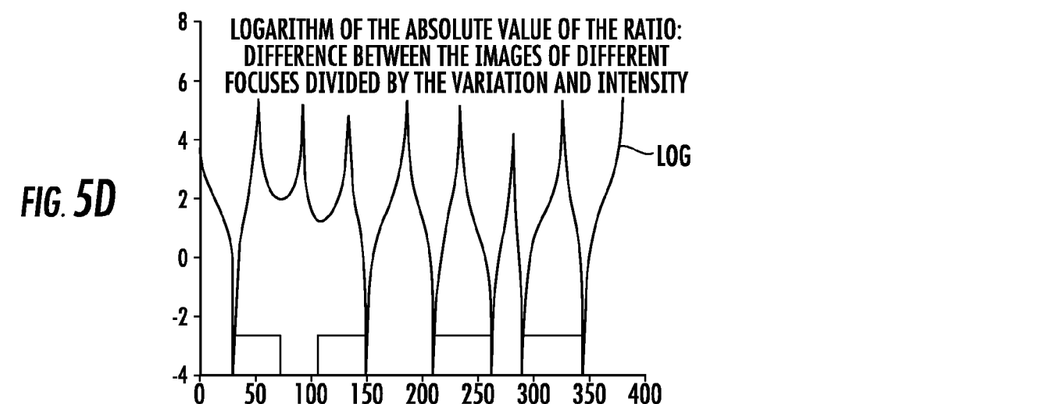

Finally, to determine the points that form a new target pattern, the logarithm of the light intensity difference ABD divided by the light intensity variation ABV is shown (curve LOG) (FIG. 5d).

Local minima in this curve (located in the vicinity of the points forming the outline of the initial target pattern MCI") form the points structuring the outline of a new target pattern. This is because when the difference between the two intensities is zero, the curve LOG tends to minus infinity, and when the intensities are not equal and the variation is maximum the curve LOG presents a local minimum.

New photolithography masks and new light sources may be designed with the new target pattern obtained, thereby allowing new simulations to be implemented with the object of improving the target pattern to obtain a final mask and a final source that are not very sensitive to focal variations and to variations in light intensity.

According to one aspect, photolithography masks and light sources are obtained that form resist patterns that have a geometry that is more stable despite parameter variations in a photolithography step.

It will be noted that, with respect to the size of the dose/focus process windows, for a pattern forming a resist strip having a width of between 80 and 120 nanometers, the area of the process window is multiplied by six. For a two dimensional pattern having a critical dimension of 28 nanometers, the process window may approximately double in size.

That which is claimed:

1. A method of making at least one of a new photolithography mask and a new light source comprising:
   generating an initial photolithography mask and an initial light source using an initial target pattern generated using an initial group of points corresponding to a desired target pattern in a resist layer;
   generating a new target pattern by at least
      performing a plurality of photolithography simulations using the initial photolithography mask and the initial light source and, respectively, a plurality of different focuses, each simulation generating a set of simulated light intensity values associated with a set of points on the resist layer, and
      defining, among the sets of points, a group of points comprising at least one of points in the resist layer for which a value of the simulated light intensity is the same for both simulations and points forming local maxima in a variation in the simulated light intensity values obtained by one of the plurality of simulations, the group of points forming the outline of the new target pattern, each point in the group of points corresponding to a point in the initial group of points; and
   generating at least one of the new photolithography mask and the new light source based upon the new target pattern.

2. The method according to claim 1, further comprising repeating the generating of the new target pattern, and the generating of the at least one of a new photolithography mask and a new light source using at least one of the new photolithography mask as the initial mask and the new light source.

3. The method according to claim 1, wherein the points forming local maxima in the variation in the simulated light intensity values are obtained by one of the plurality of simulations.

4. The method according to claim 1, wherein the group of points are defined by at least:
   determining local minima in an absolute value of a difference in a simulated light intensity value obtained by the plurality of simulations; and dividing the difference by a normalized derivative of light intensity along an axis perpendicular to the initial target pattern and passing through a point in the initial target pattern, the light intensity being obtained by one of the plurality of simulations.

5. The method of claim 1, further comprising checking the new target pattern.

6. An electronic system comprising:
a processor and memory coupled thereto and configured to
generate an initial photolithography mask and an initial light source using an initial target pattern generated using an initial group of points corresponding to a desired target pattern in a resist layer,
generate a new target pattern by at least
perform a plurality of photolithography simulations using the initial photolithography mask and the initial light source and, respectively, a plurality of different focuses, each simulation generating a set of simulated light intensity values associated with a set of points on the resist layer, and
define, among the sets of points, a group of points comprising at least one of points in the resist layer for which a value of the simulated light intensity is the same for both simulations and points forming local maxima in a variation in the simulated light intensity values obtained by one of the plurality of simulations, the group of points forming the outline of the new target pattern, each point in the group of points corresponding to a point in the initial group of points, and
generate at least one of a new photolithography mask and a new light source based upon the new target pattern.

7. The system according to claim 6, wherein said processor is configured to repeat the generating of the new target pattern, and the generating of the at least one of a new photolithography mask and the new light source using at least one of the new photolithography mask as the initial mask and the new light source.

8. The system according to claim 6, wherein said processor is configured to obtain the points forming local maxima in the variation in the simulated light intensity values by one of the plurality of simulations.

9. The system according to claim 6, wherein said processor is configured to define the group of points by at least:
determining local minima in an absolute value of a difference in a simulated light intensity value obtained by the plurality of simulations; and
dividing the difference by a normalized derivative of a light intensity along an axis perpendicular to the initial target pattern and passing through a point in the initial target pattern, said processor being configured to obtain the light intensity by one of the plurality of simulations.

10. The system according to claim 6, wherein said processor is further configured to check the new target pattern.

11. A non-transitory computer-readable medium for use with an electronic system, and having computer-readable instructions for causing the electronic system to perform the steps comprising:
generating an initial photolithography mask and an initial light source using an initial target pattern generating using an initial group of points corresponding to a desired target pattern in a resist layer;
generating a new target pattern by at least
performing a plurality of photolithography simulations using the initial photolithography mask and the initial light source and, respectively, a plurality of different focuses, each simulation generating a set of simulated light intensity values associated with a set of points on the resist layer, and
defining, among the sets of points, a group of points comprising at least one of points in the resist layer for which a value of the simulated light intensity is the same for both simulations and points forming local maxima in a variation in the simulated light intensity values obtained by one of the plurality of simulations, the group of points forming the outline of the new target pattern, each point in the group of points corresponding to a point in the initial group of points; and
generating at least one of a new photolithography mask and a new light source based upon the new target pattern.

12. The non-transitory computer-readable medium according to claim 11, wherein the computer-readable instructions are for repeating the generating of the new target pattern, and the generating of the at least one of a new photolithography mask and a new light source using at least one of the new photolithography mask as the initial mask and the new light source.

13. The non-transitory computer-readable medium according to claim 11, wherein the computer-readable instruction are for obtaining the points forming local maxima in the variation in the simulated light intensity values by one of the plurality of simulations.

14. The non-transitory computer-readable medium according to claim 11, wherein the group of points are defined by at least:
determining local minima in an absolute value of a difference in a simulated light intensity value obtained by the plurality of simulations; and
dividing the difference by a normalized derivative of a light intensity along an axis perpendicular to the initial target pattern and passing through a point in the initial target pattern, the light intensity being obtained by one of the plurality of simulations.

15. The non-transitory computer-readable medium according to claim 11, wherein the computer-readable instructions are for checking the new target pattern.

* * * * *

UNITED STATES PATENT AND TRADEMARK OFFICE
CERTIFICATE OF CORRECTION

PATENT NO. : 8,627,238 B2  
APPLICATION NO. : 13/727172  
DATED : January 7, 2014  
INVENTOR(S) : Alleaume

Page 1 of 1

It is certified that error appears in the above-identified patent and that said Letters Patent is hereby corrected as shown below:

In the Claims

Claim 13, Column 10, Line 37    Delete: "instruction"  
                                Insert: --instructions--

Signed and Sealed this  
Seventh Day of October, 2014

Michelle K. Lee  
*Deputy Director of the United States Patent and Trademark Office*